United States Patent [19]

Yorimoto et al.

[11] Patent Number: 4,748,320
[45] Date of Patent: May 31, 1988

[54] IC CARD

[75] Inventors: Yoshikazu Yorimoto, Matsudo; Masashi Takahashi, Tokyo, both of Japan

[73] Assignee: Toppan Printing Co., Ltd., Tokyo, Japan

[21] Appl. No.: 923,216

[22] Filed: Oct. 27, 1986

[30] Foreign Application Priority Data

Oct. 29, 1985 [JP] Japan .................................. 60-242429

[51] Int. Cl.[4] .......................................... G06K 19/06
[52] U.S. Cl. ..................................... 235/492; 235/380
[58] Field of Search ................................ 235/380, 492

[56] References Cited
U.S. PATENT DOCUMENTS 4,582,985  4/1986  Lofberg ........................... 235/492 X Primary Examiner—Harold I. Pitts
Attorney, Agent, or Firm—Bacon & Thomas

[57] ABSTRACT

In an IC (integrated circuit) card, a CPU (central processing unit) is connected to a data bus and an address bus. A data memory is connected to the data bus and the address bus. The data memory is a rewritable memory, such as EEPROM (electrically erasable programmable read only memory) or battery backed-up RAM (random access memory). The data memory is segmented into a predetermined number of sectors each consisting of predetermined bytes. An external processing device, such as a terminal device is connected to the data bus and the address bus, via a one-bit I/O line and a port. The terminal device supplies a processing instruction via the I/O line to the third port. The CPU receives the processing instruction via the data bus, analyzes the instruction, and reads out and executes the necessary program. The CPU supplies the results of each processing to the terminal device, by way of the data bus, the port and the I/O bus.

11 Claims, 17 Drawing Sheets

FIG. 2

| DATA (8 byte) | PS | SS | SUM |
|---|---|---|---|
| 30 | 5 | 6 | 7 |

FIG. 3

| FILE NAME | TS | LS | US | FILE NAME | TS | LS | US | PS | SS | SUM |
|---|---|---|---|---|---|---|---|---|---|---|
| 1 | 2 | 3 | 4 | 1 | 2 | 3 | 4 | 5 | 6 | 7 |

FIG. 4

| FTS | FLS | NFS | DEF | EMPTY (4 byte) | PS | SS | SUM |
|---|---|---|---|---|---|---|---|
| 31 | 32 | 33 | 34 | 35 | 5 | 6 | 7 |

FIG. 6

SECTOR NO.

| | | | | | | | | | | | |
|---|---|---|---|---|---|---|---|---|---|---|---|
| 0 | 03 | 0F | 0C | 01 | FF | FF | FF | FF | FF | FF | SUM |
| 1 | D | 02 | 02 | 01 | FF | FF | FF | FF | FF | FF | SUM |
| 2 | FF | FF | FF | FF | FF | FF | FF | FF | FF | FF | SUM |
| 3 | FF | FF | FF | FF | FF | FF | FF | FF | FF | 04 | SUM |
| 4 | FF | FF | FF | FF | FF | FF | FF | FF | 03 | 05 | SUM |
| 5 | FF | FF | FF | FF | FF | FF | FF | FF | 04 | 07 | SUM |
| 6 | ** | ** | ** | ** | ** | ** | ** | ** | ** | ** | ** | ** |
| 7 | FF | FF | FF | FF | FF | FF | FF | FF | 05 | 08 | SUM |
| 8 | FF | FF | FF | FF | FF | FF | FF | FF | 07 | 09 | SUM |
| 9 | FF | FF | FF | FF | FF | FF | FF | FF | 08 | 0A | SUM |
| A | FF | FF | FF | FF | FF | FF | FF | FF | 09 | 0B | SUM |
| B | FF | FF | FF | FF | FF | FF | FF | FF | 0A | 0C | SUM |
| C | FF | FF | FF | FF | FF | FF | FF | FF | 0B | 0D | SUM |
| D | FF | FF | FF | FF | FF | FF | FF | FF | 0C | 0E | SUM |
| E | FF | FF | FF | FF | FF | FF | FF | FF | 0D | 0F | SUM |
| F | FF | FF | FF | FF | FF | FF | FF | FF | 0E | FF | SUM |

FIG. 7

| SECTOR NO. | | | | | | | | | | | |
|---|---|---|---|---|---|---|---|---|---|---|---|
| 0 | 08 | 0F | 08 | 01 | FF | FF | FF | FF | FF | FF | SUM |
| 1 | D | 02 | 02 | 01 | FF | FF | FF | FF | FF | FF | SUM |
| 2 | A | 03 | 07 | 03 | B | 05 | 05 | 01 | FF | FF | SUM | ←7a
| 3 | a1 | | | | | | | FF | 04 | SUM | ←8a
| 4 | a2 | | | | | | | 03 | 07 | SUM | ←8b
| 5 | b1 | | | | | | | FF | FF | SUM | ←9a
| 6 | ** | ** | ** | ** | ** | ** | ** | ** | ** | ** | ** |
| 7 | a3 | | | | | | | 04 | FF | SUM | ←8c
| 8 | FF | FF | FF | FF | FF | FF | FF | FF | FF | 09 | SUM |
| 9 | FF | FF | FF | FF | FF | FF | FF | FF | 08 | 0A | SUM |
| A | FF | FF | FF | FF | FF | FF | FF | FF | 09 | 0B | SUM |
| B | FF | FF | FF | FF | FF | FF | FF | FF | 0A | 0C | SUM |
| C | FF | FF | FF | FF | FF | FF | FF | FF | 0B | 0D | SUM |
| D | FF | FF | FF | FF | FF | FF | FF | FF | 0C | 0E | SUM |
| E | FF | FF | FF | FF | FF | FF | FF | FF | 0D | 0F | SUM |
| F | FF | FF | FF | FF | FF | FF | FF | FF | 0E | FF | SUM |

FIG. 8

SECTOR NO.

| # | | | | | | | | | | | | |
|---|---|---|---|---|---|---|---|---|---|---|---|---|
| 0 | 0D | 0F | 03 | 01 | FF | FF | FF | FF | FF | FF | SUM | |
| 1 | ·D | 02 | 08 | 02 | FF | FF | FF | FF | FF | FF | SUM | |
| 2 | A | 03 | 07 | 03 | B | 05 | 0C | 03 | FF | 09 | SUM | ←7a |
| 3 | a1 ||||||||| FF | 04 | SUM | ←8a |
| 4 | a2 ||||||||| 03 | 07 | SUM | ←8b |
| 5 | b1 ||||||||| FF | FF | SUM | ←9a |
| 6 | ** | ** | ** | ** | ** | ** | ** | ** | ** | ** | ** ** | |
| 7 | a3 ||||||||| 04 | FF | SUM | ←8c |
| 8 | c1 ||||||||| FF | FF | SUM | ←10a |
| 9 | C | 09 | 09 | 01 | FF | FF | FF | FF | 02 | FF | SUM | ←7b |
| A | b2 ||||||||| 05 | 0C | SUM | ←9b |
| B | ** | ** | ** | ** | ** | ** | ** | ** | ** | ** | ** ** | |
| C | b3 ||||||||| 0A | FF | SUM | ←9c |
| D | FF | FF | FF | FF | FF | FF | FF | FF | FF | 0E | SUM | |
| E | FF | FF | FF | FF | FF | FF | FF | FF | 0D | 0F | SUM | |
| F | FF | FF | FF | FF | FF | FF | FF | FF | 0E | FF | SUM | |

F I G. 15A

|  | DATA | PS | SS | SUM |
|---|---|---|---|---|
| #h |  | FF | i | OK |
| #i |  | k | k | ERROR |
| #j |  | i | FF | OK |
| #k |  | FF | FF | OK |

F I G. 15B

|  | DATA | PS | SS | SUM |
|---|---|---|---|---|
| #h |  | FF | i | OK |
| #i |  | h | j | ERROR |
| #j |  | i | FF | OK |
| #k |  | FF | FF | OK |

IC CARD

BACKGROUND OF THE INVENTION

This invention relates to an IC (integrated circuit) card, and more particularly to an IC card which contains a rewritable semiconductor memory.

An IC card with data processing function has recently been put into practical use. This IC card contains a central processing unit (CPU) and a rewritable data memory, such as an electrically erasable programmable read only memory (EEPROM), or a random access memory (RAM) which is backed up by the battery. The data memory is connected to the CPU. The IC card has on its surface terminals for data transfer with the external device such as the terminal devices. The terminals are not necessary if data transfer is a non-contact type, for example, via a microwave or an optical beam. This type of IC card can be considered to be a microcomputer in the shape of a card. However, the major difference of this type of IC card from the ordinary microcomputer resides in that, because of its card-like shape, the CPU and the data memory of the IC card are physically limited. Therefore, the capacity of the data memory has also a limit. It follows that an efficient use of the memory is required.

Recently, the IC card used for multi-purposes, called a multi-use type IC card has been proposed. In the multi-use type IC, a plurality of files are stored in the data memory, and the file access and file control must be controlled effectively.

The data memory in an IC card has been used in the following two ways:

(1) The entire memory space is sequential. The memory addressing is based on the absolute address supplied from the external device.

(2) The memory is segmented into a plurality of blocks. The memory addressing is performed by the logical address, viz., the offset value from the top address of the block.

The way (1) of the IC card memory has the following drawbacks.

(a) The layout of the memory has to be determined in system design. When it is requested later to expand the file or to register a new file, it is difficult to satisfy such a request.

(b) The memory area for each file must have a larger area than the expected maximum file. It often entails unnecessary use of the memory.

(c) For defective addresses (memory cells), if present, the IC card cannot take any measure by itself.

(d) Addressing is complicated.

The way (2) also involves the above problems (a) to (c).

SUMMARY OF THE INVENTION

An object of this invention is to provide an IC card with a rewritable data memory which can effectively use the memory.

Another object of this invention is to provide an IC card in which, in the data memory, the new file can be easily prepared, and the existing file can be easily expanded.

Yet another object of this invention is to provide an IC card which provides an exact and quick access to the files in the data memory.

A further object of this invention is to provide an IC card, in which, when there is a defective address, another normal address is used in place of the defective address, and therefore no abnormality can be seen from outside.

An additional object of this invention is to provide an IC card which keeps high security among a plurality of files stored in the data memory.

According to this invention, there is provided an IC card comprising:

a rewritable memory which is segmented into a plurality of sectors, and means for controlling the input and output of data to and from the memory, the control means including:

means for chaining a plurality of sectors in accordance with the length of a file to be recorded, means for registering, in a predetermined sector, the sector chaining data of each file, and means for accessing a file based on the sector chaining data.

BRIEF DESCRIPTION OF THE DRAWINGS

FIG. 2 shows a view illustrating the layout of a data sector in the data memory of this embodiment;

FIG. 3 shows a view illustrating the layout of a directory sector and a file control area (FCA) sector in the data memory in this embodiment;

FIG. 4 shows a view illustrating the layout of the memory control area (MCA) sector in the data memory;

FIG. 6 shows a memory map of the initialized data memory;

FIG. 7 shows a memory map of the data memory when a file is prepared in the data memory;

FIG. 8 shows a memory map of the data memory when another file is made in the data memory;

FIGS. 15A and 15B show a layout of the sectors useful in explaining the repair of sector chaining.

DETAILED DESCRIPTION OF THE PREFERRED EMBODIMENT

An embodiment of the IC card according to this invention will be described referring to the following drawings.

Figure 1:
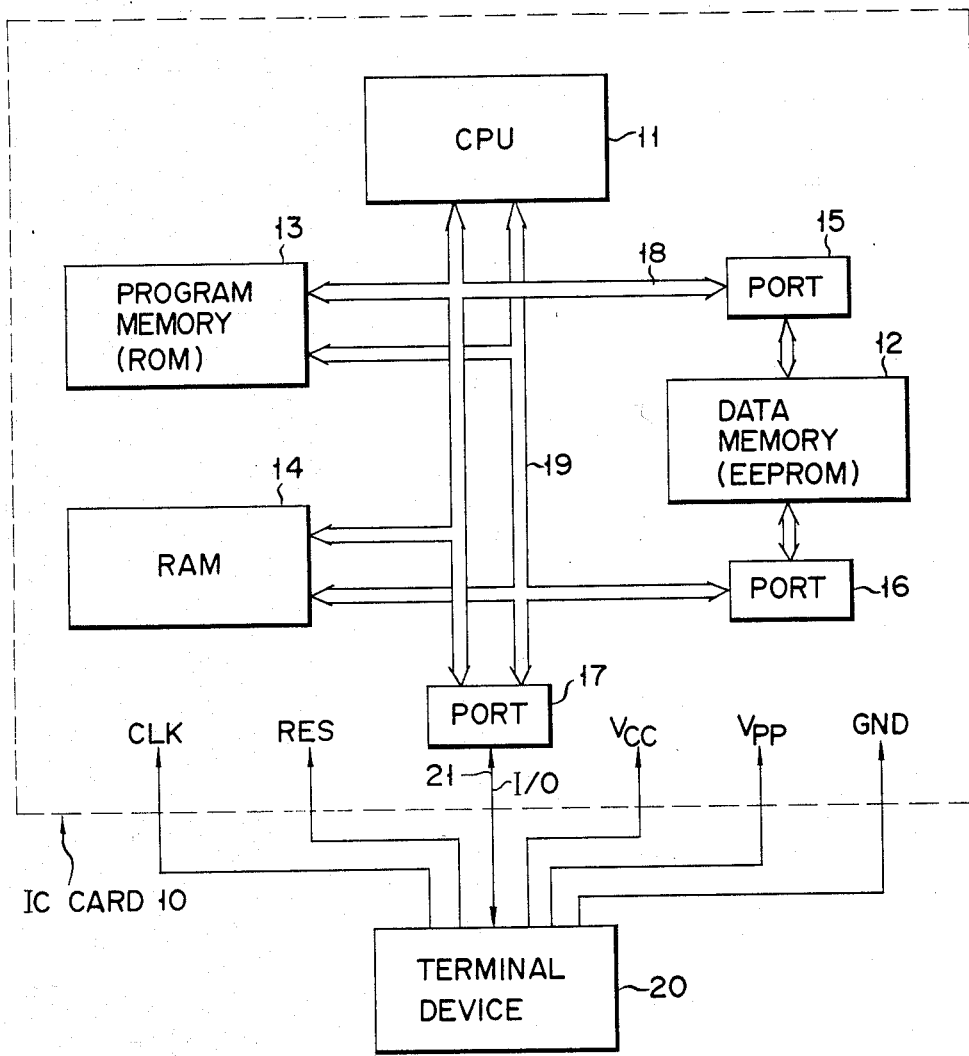
FIG. 1 is a block diagram illustrating an arrangement of an embodiment of an IC card according to this invention.

FIG. 1 is a block diagram illustrating an arrangement of IC card 10. CPU 11 is connected to data bus 18 and address bus 19. Data memory 12 is connected to data bus 18 via first port 15, and to address bus 19 via second port 16. Data memory 12 is a rewritable memory such as an EEPROM or an RAM which is backed up by a battery. Its memory capacity is 192 bytes and the memory area is segmented into 16 sectors each of 12 bytes. The capacity of 192 bytes is used here for ease of explanation, but it can be 16K bytes, 64K bytes, etc.

Data bus 18 and address bus 19 are also connected to program memory 13, RAM 14 and third port 17. Program memory 13 is a read only memory. RAM 14 is a memory for providing a working area when CPU 11 executes the program stored in program memory 13. Third port 17 is connected to external processing unit 20 (so-called a terminal device) via serial I/O line 21. Terminal device 20 feeds to IC card 10 clock pulse CLK, reset pulse RES, and power supply voltage Vcc. It also feeds write voltage Vpp when the write voltage other than Vcc is required and ground voltage GND. Terminal device 20 and IC card 10 are electrically connected via the connector installed on the surface of IC card 10.

Terminal device 20 sends a processing instruction to third port 17 via I/O line 21. CPU 11 receives the processing instruction via data bus 18, decodes the contents of the instruction, reads the necessary program from program memory 13, and then executes the program. When terminal device 20 accesses data memory 12 contained in IC card 10, the logical address has to be used. When CPU 11 accesses data memory 12, the absolute address has to be used. For this purpose, CPU 11 performs logical-absolute address conversion, using a formula (1) to be described later and outputs the absolute address to address bus 19 to access data memory 12.

The I/O data is transferred between CPU 11 and terminal device 20 via bidirectional data bus 18 and third port 17.

CPU 11 supplies to terminal device 20 the result of each processing, via data bus 18, third port 17 and I/O bus 21.

The memory map of data memory 12 will be now described. As explained earlier, data memory 12 is segmented into 16 sectors each consisting of 12 bytes. These sectors are functionally classified into a data sector, a directory sector, an FCA (file control area) sector and an MCA (memory control area) sector. If necessary, a plurality of sectors are coupled in a chain fashion. In each sector, first to eighth bytes are data fields. Ninth and tenth bytes are PS and SS fields which store the numbers of the sectors preceding to and succeeding to that sector. Eleventh and twelfth bytes form SUM field for checking if each byte of that sector is proper or not. The SUM field may be CRC-16, and EX-OR, CRC-8 or mere arithmetic sum. If EX-OR, CRC-8 or arithmetic sum is used, the SUM field may be constructed with one byte, not two bytes.

FIG. 2 shows a layout of the data sector. Data field 30 is the field freely used by the user and the system. The application file is constructed by chaining a plurality of data sectors, if necessary.

FIG. 3 shows a layout of the directory sector where the data of the application file is registered. The directory sector is used to improve the speed of file access, and enables the quick calculation of file volume. The directory sector can be used equivalent to the data sector, and therefore its size or the number of sectors can be expanded. As the directory data for a file, file name field 1 (1 byte), TS (top sector) field 2 (1 byte), LS (last sector) field 3 (1 byte) and US (used sector) field (1 byte), or total of 4 bytes are necessary. Therefore, directory data for two application files are registered in the data field of one directory sector. Registered to TS field 2 is the number of the top sector from which the application file is registered. Registered to LS field 3 is the number of the last sector in which the last of the application file is registered. The size of the application file (or the number of files) is registered in US field 4.

The top and last of a file are indicated by setting FF in PS field 5 and SS field 6.

FIG. 4 shows a layout of the memory control area (MCA) for storing the data how the entire memory area of the data memory is used. Data fields necessary for the MCA sector are FTS fields 31 (1 byte), FLS field 32 (1 byte), NFS field 33 (1 byte) and DFF field 34 (1 byte), and needs the total of 4 bytes. The data field contains the unused empty field of fifth to eighth bytes. The top sector number of the unused sectors is registered in FTS field 31. The last sector number of the unused sectors is registered in FLS field 32. The total number of unused sectors are registered in NFS field 33. DEF field 34 registers the sector number of the sector having a directory of the directory file, i.e., the file control area FCA. The directory is for the purpose of improving the speed of file access. The format of FCA is the same as that of the directory (FIG. 3).

In the data file and the directory file, each sector has a PS and an SS for sector chaining. Therefore, even if the chain between sectors has been disconnected for some reason, if the disconnection is only one, it is possible to find and repair the disconnection by tracing the sector chain, starting from TS and LS, while referring to SS and PS.

Figure 5:
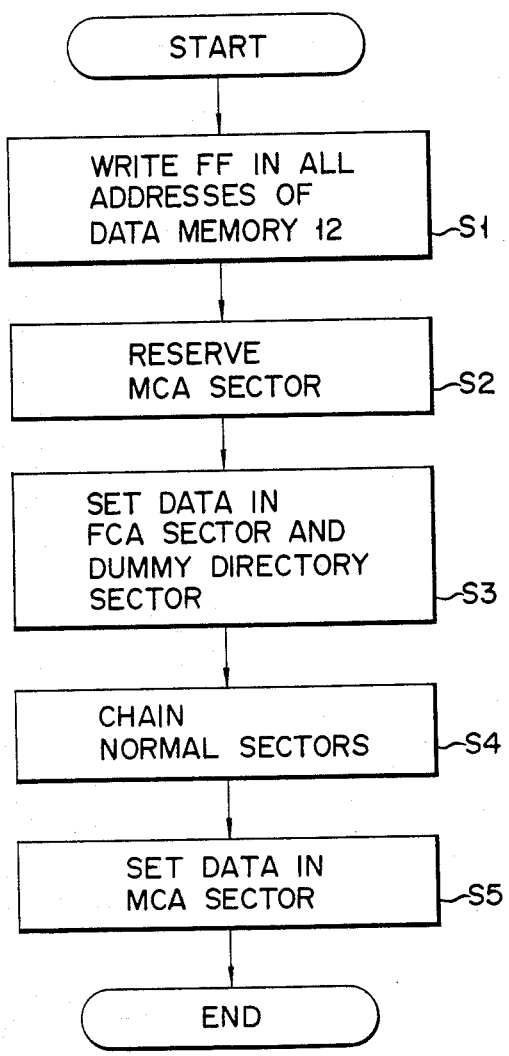
FIG. 5 shows a flowchart illustrating the initialization of the data memory of the embodiment.

The operation of this embodiment will now be described. Before using the IC card, or writing into data memory 12, data memory has to be initialized. FIG. 5 shows a flowchart illustrating the initialization of data memory 12. FIG. 6 is a memory map of data memory 12 after its initialization.

In step S1, FF is written into all the addresses in data memory 12. Here, one byte equals one address. At this time, the sectors where error occurred are registered in RAM 14. In step S2, the top sector of all the sectors that proved to be normal (sector 0 in the example in FIG. 6) is reserved as the MCA sector.

In step S3, the second normal sector (sector 1 in FIG. 6) is set to the FCA sector. D is written into the file name of FCA sector, the third normal sector's number (sector 2 in FIG. 6) into TS, TS into LS, 01 into US, FF into PS and FF to SS. By this writing, the sector designated as TS is reserved as the dummy directory. At this time, the registered sector number of FCA (sector 1 in FIG. 1) is written into the DEF of MCS sector.

In step S4, the remaining normal sectors are chained. More specifically, the numbers of the normal sectors preceding and succeeding to and coupled with one sector are registered in PS and SS fields of the sector and reserved as unused files. At this time, the sectors where write errors occurred (sector 6 in FIG. 6) is registered in RAM 14 as defective sectors, and at the same time they are omitted from the chain.

In step S5, based on the numbers of the defective sectors registered in RAM 14, FTS, FLS and NFS are calculated and the calculated ones are written into a predetermined area. At this point, the initializing operation ends.

FIG. 7 is the memory map of the data memory when file A consisting of three data sectors 8a, 8b and 8c (data fields of a1, a2,a3) and file B consisting of one data sector 9a (data field of b1) are formed anew in the IC card. In FIG. 7, the data is registered in directory sector 7a, which was a dummy in FIG. 6. In accordance with the generation of files, FTS, FLS and NFS in MCA are renewed. Further, data sectors in file A are coupled together, and the chain of the normal sectors are partially corrected.

In the memory map illustrated in FIG. 8, file C is formed anew, which consists of a data sector 10a (data field of c1), and file B is expanded with 9b and 9c (data fields of b2 and b3). Since file C is registered anew, the directory file, which consisted of one sector has now expanded to have two sectors 7a and 7b. The expanded directory file 7b is coupled directly with the existing directory file 7a.

The data sectors included in file B are coupled with one another. With this coupling, the directory file of file B is also updated. The coupling of the unused normal sectors is also partially corrected. Sector B has a write error when data b3 was expanded. Therefore, it is omitted from the sector chain, as a defective sector. The data is fed back to MCA of sector 0, and then FTS and NFS are updated.

Figure 9:
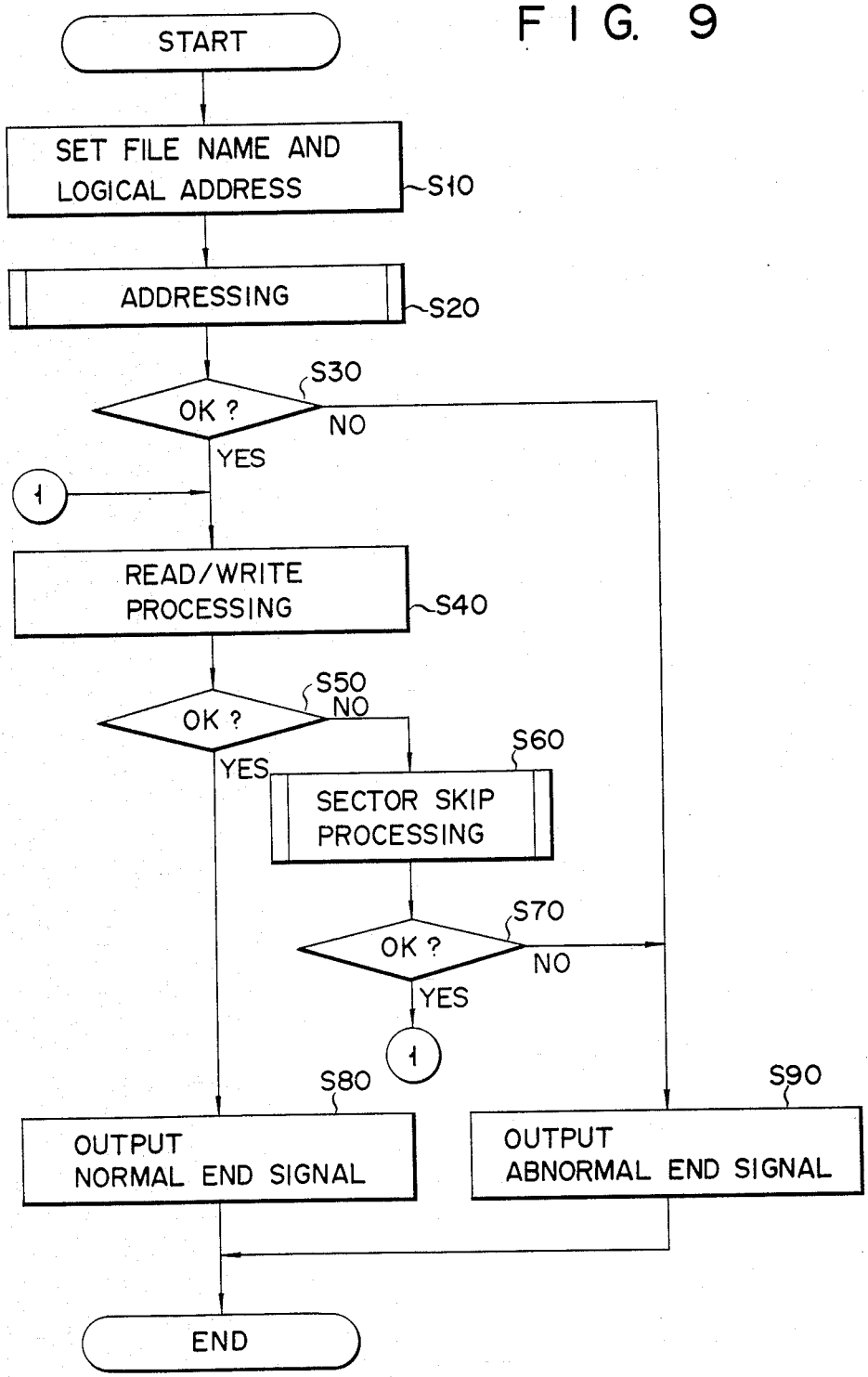
FIG. 9 shows a flowchart illustrating the read/write operation of the memory.

FIG. 9 is a flowchart illustrating the accessing (read-/write) operation to data memory 12. In step S10, the address included in the processing instruction which is supplied to third port 17 in IC card 10 via I/O line 21 from the external processing unit 20, is written into RAM 14.

This address is a logical address which starts at "0" for every file. However, the addressing between CPU 11 and data memory 12 is performed by the absolute address, as the hardware requires it. For this reason, the logical to absolute address conversion is performed in CPU 11. This process is programmed into a subroutine. In step S20, by using this subroutine, the addressing of data memory 12 is performed via second port 16 and address bus 19.

In step S30, it is determined whether or not write errors occurred in MCA and FCA at the time of this addressing. If any write error occurred, the abnormal end signal is output to third port 17 in step S90, and this signal is supplied to external processing unit 20 via I/O line 21 to terminate processing.

When there are no errors, the memory location as addressed in step S20 is accessed via first port 15 and data bus 18 at step S40.

In step S50, it is determined whether or not there were any write errors during this read/write operation. If there were none, the normal end signal is output to third port 17 in step S80, and is supplied to external processing device 20 to terminate the processing.

If there was a write error, the sector skip operation is done in step S60. This sector skip processing is also programmed into a subroutine.

In step S70, it is determined whether or not there were any write error during the sector skip processing. If there were any, the abnormal end signal is output in step S90, and the processing is terminated.

When it is judged that there are no write errors, control is returned to step S40.

Figure 10:
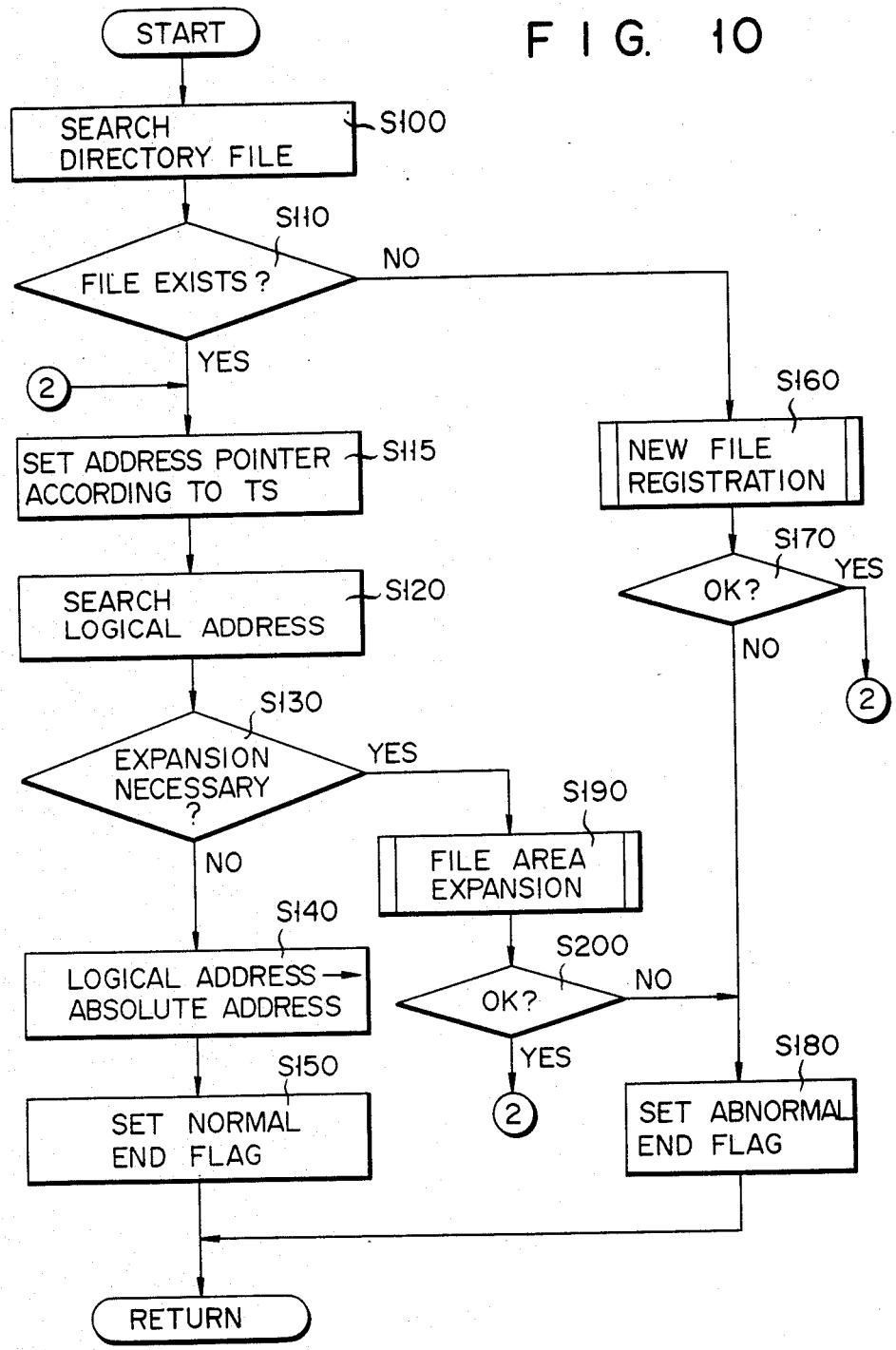
FIG. 10 shows a flowchart illustrating the addressing of the memory shown in FIG. 9.

FIG. 10 is a flowchart illustrating the addressing subroutine in step S20 of FIG. 9.

In step S100, CPU 11 sequentially searches the directory file containing the name of the processed file. The file name is included in the processing instruction which is input from external processing device 20.

In step S110, it is judged whether the directory file containing the name of the processed file exists in data memory 12.

If not exist, a new file is registered in step S160. The process of preparing a new file is also programmed into a subroutine.

After the new file is made, it is judged whether or not there are any write errors in S170. If there are, an abnormal end status flag is set and control goes back to the main routine.

In step S110, when it is judged that the directory file has been stored in data memory 12, and when in step S170, it is judged that there is no write error, the address pointer is set to the top address of the file using the TS of the directory file found in step S100, in step S115. The absolute address indicated by the logical address is searched in step S120. During this searching process, the address pointer as set in step S115 is advanced until the logical address as set in step S10 (in the main routine) is reached. The sector number in which the address pointer will finally be set, and the offset value from the top of that sector of the address pointer are obtained. The advancing of the address pointer is executed as follows:

1. To trace only the data field.
2. To read the SS of that sector at the end of one sector, and to set the address pointer at the top of the succeeding sector.

In step S130, CPU judges whether or not the file area must be expanded. It is determined whether or not the input logical address designates the area outside the existed file area. If so, the file area expanding processing is executed in step S190. This expanding processing is also programmed into a subroutine.

After the expanding processing, it is judged whether or not a write error is present in step S200. If the write error is present, control goes to step S180 where an abnormal end status flag is set and, returns to the main routine. In step S200, if the write error is not present, control is returned to step S115.

If it is judged that there is need for expanding the file area in step S130, the logical address is converted into an absolute address according to the following formula in step S140, and the absolute address is stored in RAM 14. In step S150, a normal end status flag is set, and the control is returned to the main routine.

$$Absolute\ address = SEC \times 12 + OFT \quad (1)$$

where SEC indicates the number of the sector into which the address pointer is to finally be set, and OFT is an offset value from the top of the SEC sector of the address pointer.

Figure 11A:
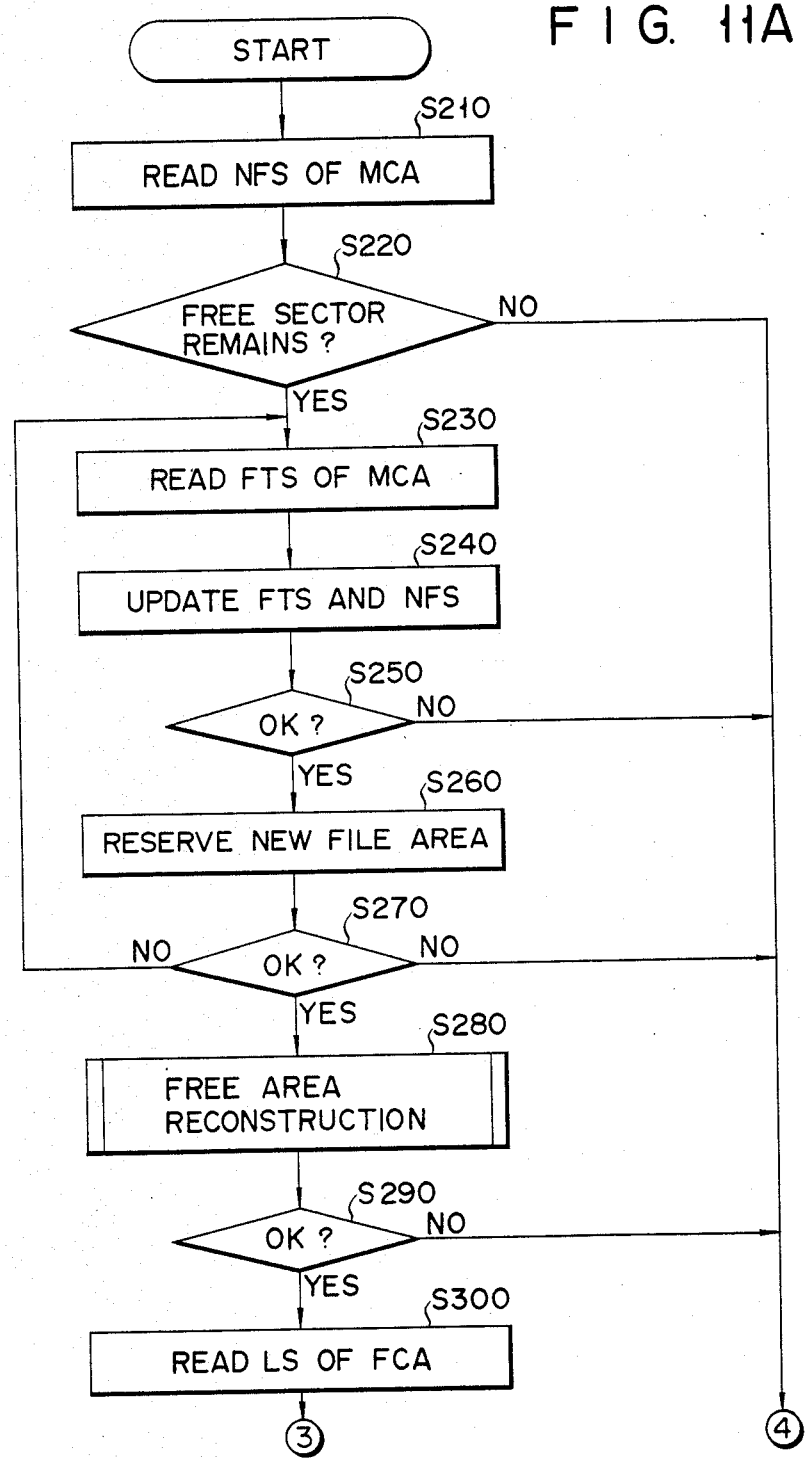
FIGS. 11A and 11B cooperatively show flowcharts for registering a new file.
Figure 11B:
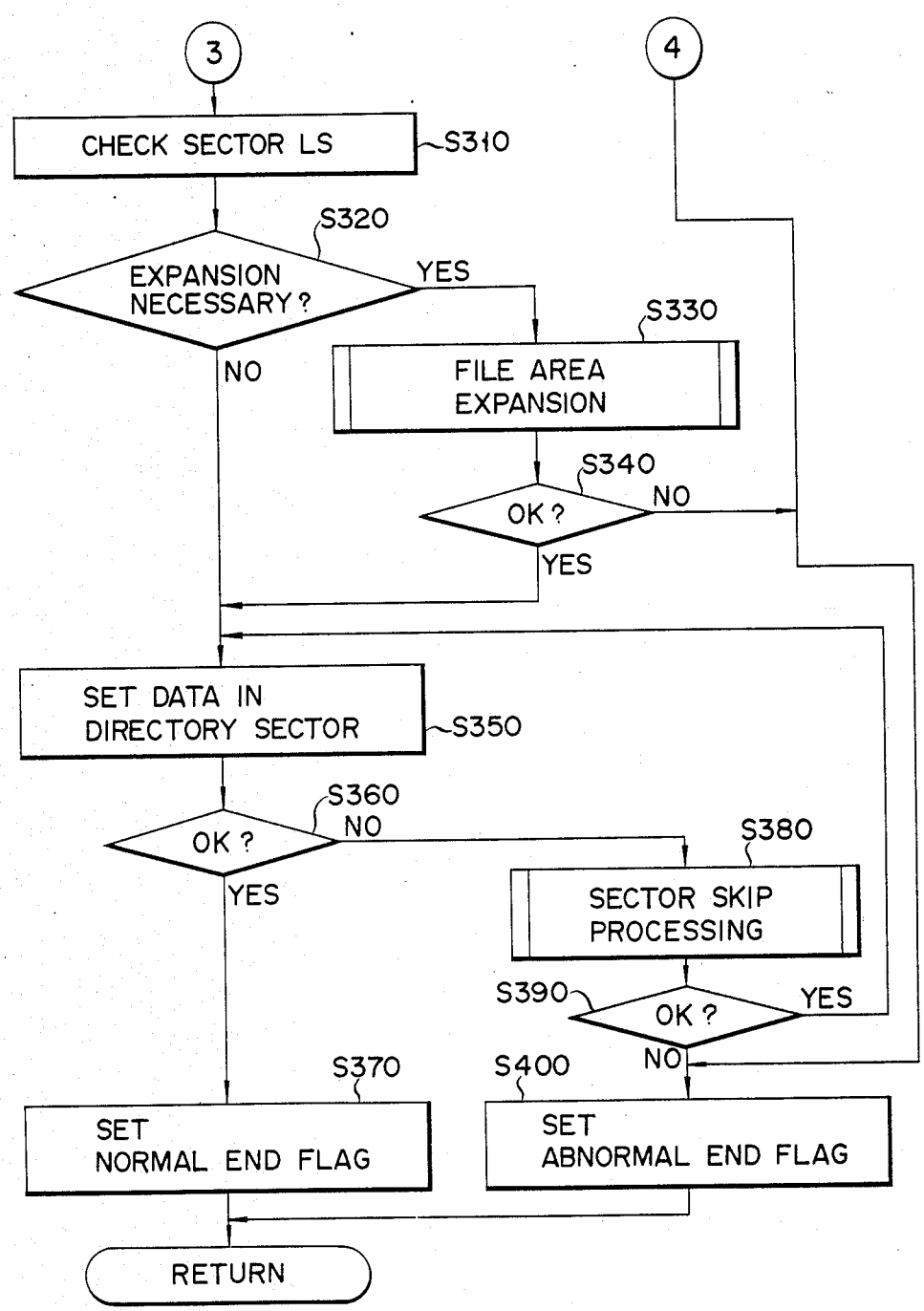

FIGS. 11A and 11B cooperatively show a flowchart of a new file registration subroutine (step S160) in FIG. 10.

In step S210, the NFS of MCA is read. In step S220, it is determined whether or not free sector remains. If it is determined that there is no free sector, the abnormal end flag is set in step S400, and control is returned to the main routine. If it is determined that a free sector is present, the top address of the free sector (FTS of MCA) is read in step S230. In step 240, the sector number of a free sector succeeding to the free sector as obtained in step S230 is set to FTS, and a value representing the result of subtraction of 1 from the NFS at that time is set to NFS.

In step S250, whether or not a write error occurs during this processing is judged. If the write error occurs, the abnormal end status flag is set in step S400.

If the write error does not occur, FF is set in the SS of the free sector as obtained in step S230 in step S260, and this free file is reserved as a new file area.

In step S270, if a write error is present or not during this process is judged. If the write error is present, control is returned to step S230. If the write error is not present, the subroutine for reconstructing the free area is executed in step S280.

In step S290, whether or not a write error is present during this processing is judged. If the write error is present, the abnormal end status flag is set in step S400 and control is returned to the main program.

If the write error is not present, the LS of FCA is read in step S300. The contents of sector LS is checked in step S310. That is to say, it is judged whether or not the area to form the directory file for a new file is present in the directory file. In step S320, it is checked whether or not the directory file area is to be expanded.

If the answer is yes, the file expanding subroutine is executed in step S330. It is determined whether or not a write error occurs during this processing in step S340. If the write error occurs, the abnormal end status flag is set in step S400, and control is returned to the main program.

It is determined that there is no need for the file area expanding in step S320 and it is determined that no write error occurs in step S340, the data as shown below, is written into the area as reserved as the directory preparation area, to register the directory file in step S350.

File name: File name as designated by terminal device 20.
TS: Sector number as reserved in step S260.
LS: TS
US: 1
PS: Sector number of the sector preceding to and coupled with the sector.
SS: FF In step S360, it is determined whether or not a write error occurs during this processing. If the write error is not present, the normal end status flag is set in step S370 and control is returned to the main program.

If the write error is present, the sector skip routine is executed in step S380. In step S390, if the write error occurs or not during this processing, is checked. If no write error is present, control is returned to step S350.

If it is found that the write error is present in step S390, the abnormal end status flag is set in step S400, and control is returned to the main program.

Figure 12:
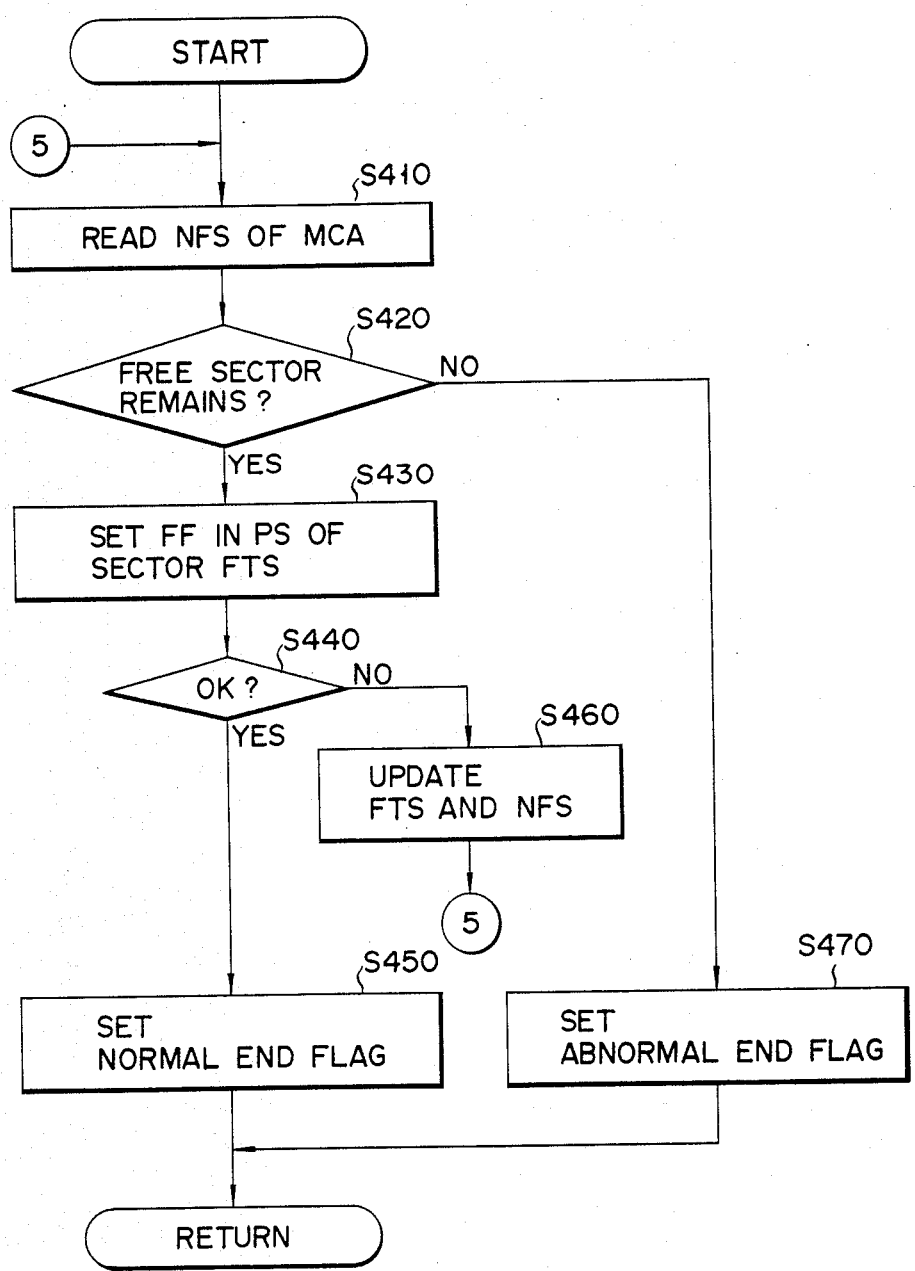
FIG. 12 shows a flowchart for reconstructing the free area shown in FIGS. 10, 11A, and 11B.
Figure 13A:
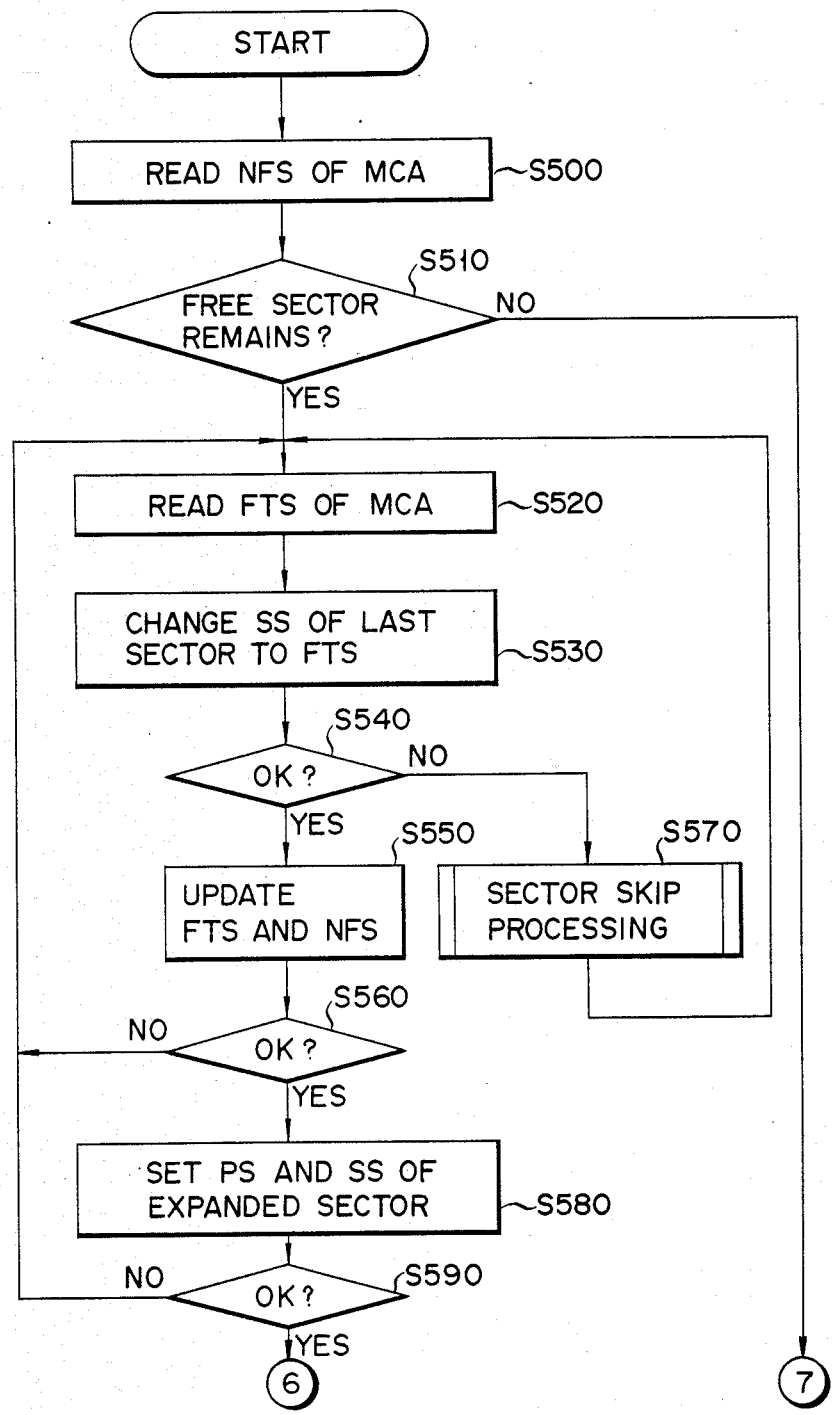
FIGS. 13A and 13B cooperatively show a flowchart for expanding a file area shown in FIGS. 10, 11A, and 11B.
Figure 13B:
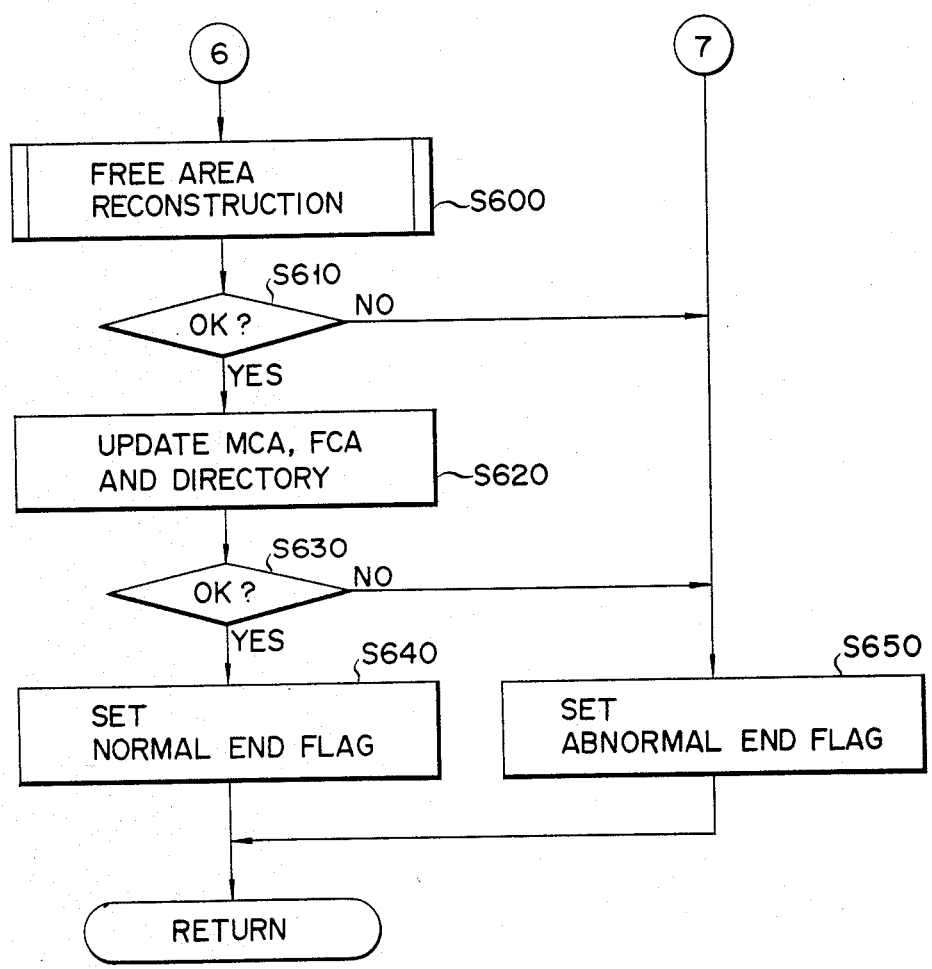
Figure 14A:
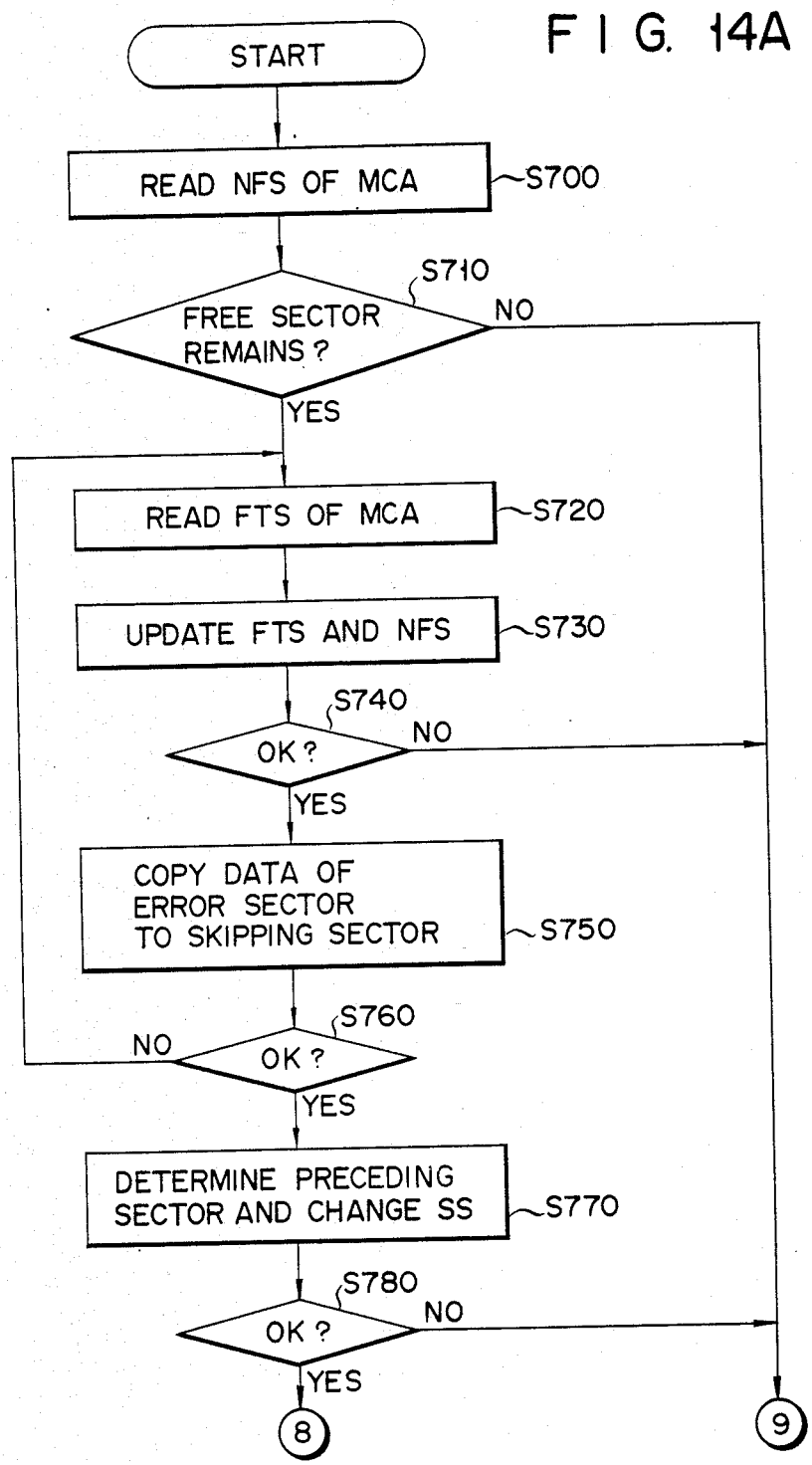
FIGS. 14A and 14B cooperatively show a flowchart of sector skipping shown in FIGS. 10 and 11B.
Figure 14B:
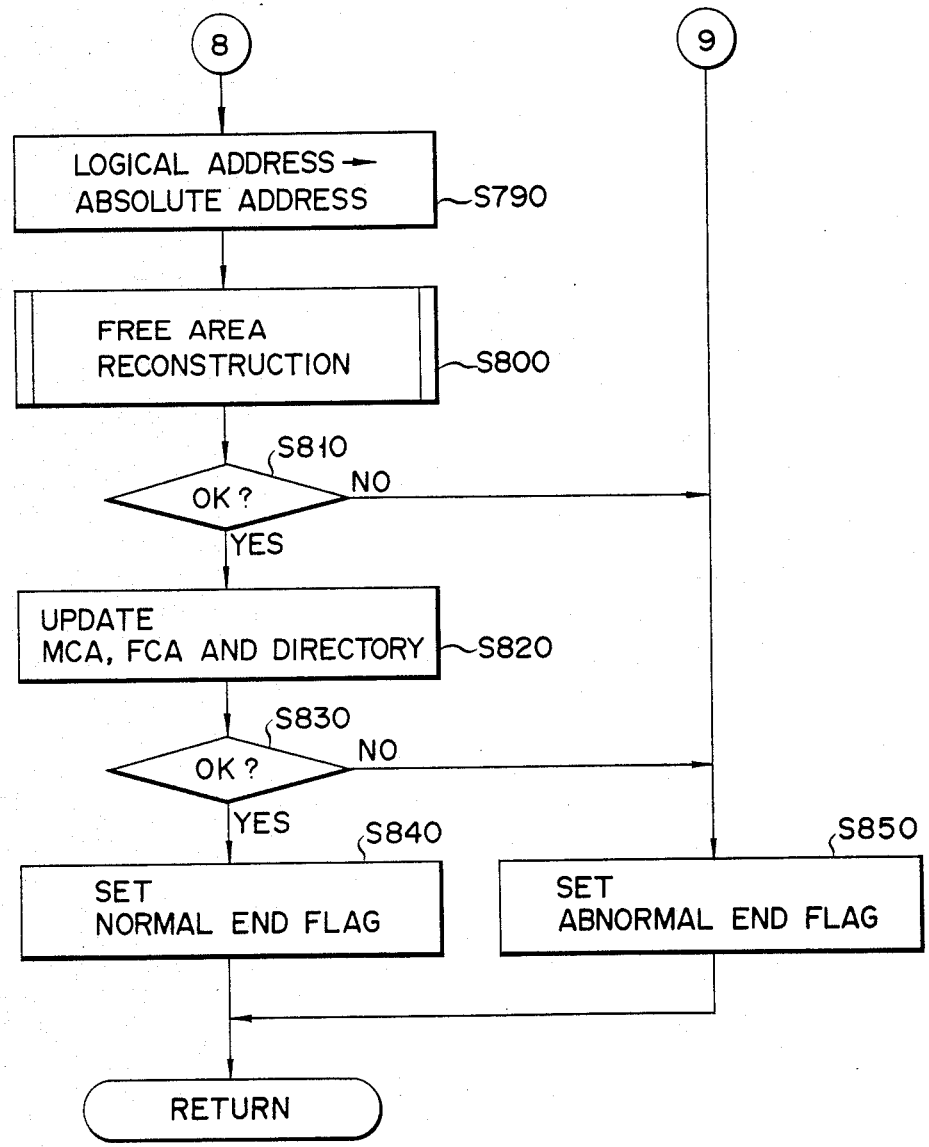

FIG. 12 shows a flowchart for reconstructing the free area (step S280) in FIG. 11A, (step S600) in FIG. 13B, and (step S800) in FIG. 14B. The subroutine is for setting FF in the PS of the sector indicated by the FTS, and defines the top sector of the unused file. In step S410, the NFS of MCA is read. It is judged whether or not a free sector remains in step S420. If there is no free sector, the abnormal end status flag is set in step S470, and control is returned to the main routine.

If the free sector remains, FF is set in the PS of the sector indicated by the FTS in step S430. In step S440, check is made as to whether or not the write error is present during this processing. If the write error is present, the FTS and NFS of MCA are updated in step S460, and control is returned to step S410. If the write error is not present, the normal end status flag is set in step S450 and control is returned to the main routine.

FIGS. 13A and 13B cooperatively show a flowchart of the file area expanding subroutine in FIGS. 11A and 11B.

In step S500, MCA and NFS are read. In step S510, it is determined whether or not a free sector remains in data memory 12. If the free sector does not remain, the abnormal end status flag is set in step S650 and control is returned to the main program.

If the free sector remains, the top address of the free sector (FTS of MCA) is read in step S520. The FTS is set in the SS of the last sector in the file in step S530. It is determined in step S540 whether or not there is a write error during this processing. If the write error is present, the sector skip subroutine is executed in step S570, and control is returned to step S520.

If the write error is not present, the FTS and NFS of MCA are updated in step S550 on the basis of the result of the file area expanding processing.

In step S560, it is checked whether or not a write error is present during this processing. If the write error is present, control is returned to step S520. If the write error is not present, the sector number as obtained in step S530 is set in the PS of the expanded sector of that file, and FF is set in the SS of that sector in step S580. At this point, the chaining of the sectors is completed.

In step S590, it is checked whether or not there is a write error during this processing. If a write error is present, control is returned to step S520. If there is no write error, the subroutine for reconstructing a free area is executed in step S600.

In step S610, it is checked whether or not there is a write error during this processing. If the write error is present, the abnormal end status flag is set in step S650, and control is returned to the main program.

If there is no write error, MCA, FCA, and the data as have been stored in the directory of the file are updated in step S620 on the basis of the contents of the data memory at the end of step S610 execution.

In step S630, the presence or absence of a write error during this process is checked. If no write error is present, a normal end status flag is set in step S640, and control is returned to the main program. If the write error is present, the abnormal end status flag is set in step S650, and control is returned to the main program.

FIGS. 14A and 14B show a flowchart of the sector skip subroutine (step S60) in FIG. 9, (step S380) in FIG. 11B, and (step S570) in FIG. 13A.

The NFS of MCA is read in step S700. It is determined whether or not the free sector of data memory 12 remains in step S710. If the free sector does not remain, the abnormal end status flag is set in step S850 and control is returned to the main program.

If the free sector remains, the top address of the free sector (FTS of MCA) is read in step S720. In step S730, the sector number of the sector succeeding to that as obtained in step S720 is set into FTS and a value representing the result of the subtraction of 1 from the NFS at that point is set in NFS.

It is determined in step S740 whether or not a write error occurs during this processing. If the write error is present, the abnormal end status flag is set in S850, and the control is returned to the main program.

If the write error does not occur, in step S750, the status of the sector with the error before its error correction is read out and is copied into the sector as obtained in step S720.

In step S760, the presence or absence of the write error during this process is checked. If the error is present, control is returned to step S720. If it is not present, the preceding sector, in step S770, is searched, using the PS of the copied sector, and the sector number of the sector prepared anew in step S750 is set in SS of the preceding sector. In step S780, the presence or absence of the write error during this processing is checked. If the write error is present, the abnormal end status flag is set in step S850, and control is returned to the main program.

If the error is not present, the logical address is converted into the absolute address using the formula (1) in step S790. In step S800, the subroutine for reconstructing the free area is executed.

In step S810, the presence or absence of the write error during this processing is checked. If the write error is present, the abnormal end status flag is set in step S850 and the control is returned to the main program.

If the write error is not present, in step S820 MCA, FCA and directory are updated.

In step S830, the presence or absence of the write error during this processing is checked. If the write error is not present, the normal end status flag is set in step S840, and control is returned to the main routine. If it is present, the abnormal end status flag is set in step S850, and control is returned to the main routine.

As described above, in this embodiment, the data memory is segmented into a plurality of sectors. The sectors are chained for each application, and the data relating to the chain is stored in the directory. With this feature, the data memory can be effectively used. The file area can readily be expanded and contracted by changing the chain of sectors.

The restoring processing of the chain data in the PS and SS fields of the sector, which contain an error, will be described, using the SUM field at the 11th and 12th bytes in one sector. Reference is made to FIGS. 15A and 15B.

In the figure, the SS field of the sector h represents sector i, but the PS field of the sector i represents sector k. At this stage, it is unobvious whether one or both contain error. Since the SUM field of sector h is proper and the SUM field of sector i is improper, it can be seen that sector h should succeed to sector i. Similarly, the SS field of sector i represents sector k and the PS field of sector j represents sector i. Since the SUM field of sector i is improper and the SUM filed of sector j is proper, it can be understood that the sector j should succeed to sector i. As a result, the chain data of the PS and SS fields are rewritten as shown in FIG. 15B.

Figure 16:
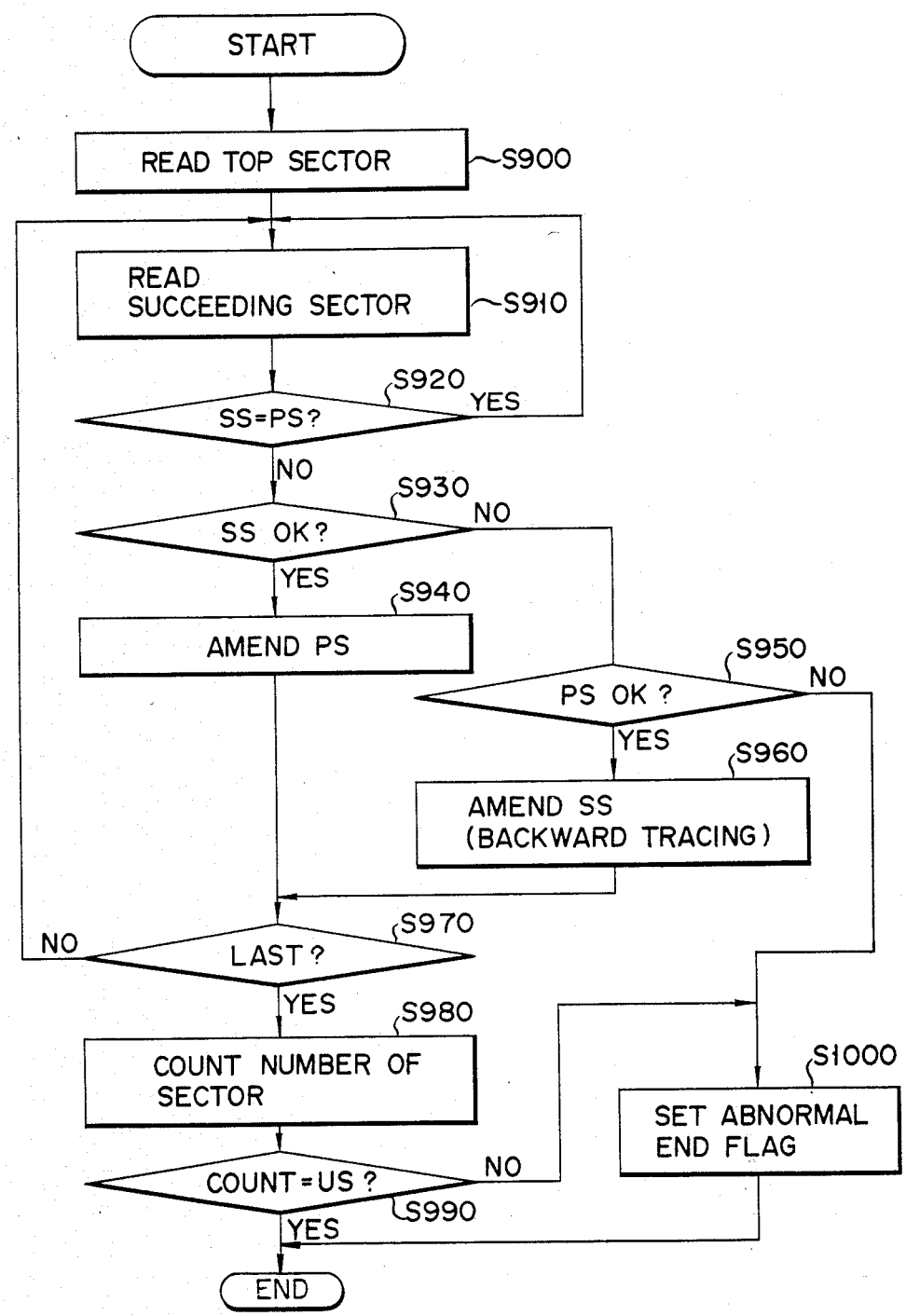
FIG. 16 shows a flowchart useful in explaining the repair of sector chaining.

A chart illustrating a flow of the restoring processing of the sector chaining data is illustrated in FIG. 16. In step S900, the top sector of the file to be accessed is read out according to the TS of the directory. In step S910, the succeeding sector to be coupled is read out on the basis of the SS field of the read out sector. In step S920, the PS field of the succeeding sector is read out, and then whether or not the coupling of sectors is proper or not is checked depending on whether or not the SS and PS fields are coincident with each other. If these fields are coincident with each other and the coupling of sectors is proper, control is returned to step S910.

On the other hand, if these are not coincident with each other, and the sector coupling is improper, the repair processing is executed. It is determined whether or not the SS field is proper referring to the SUM field, in step S930. When the SS field is proper (in the case of sectors h and i in FIG. 15A), the PS field is rewritten in step S940. When the SS field is improper, it is determined whether or not the PS field is proper or not in step S950. If the PS field is proper (in the case of sectors i and j in FIG. 15A), what the SS field of the abnormal sector should be rewritten to, is unknown, and it is impossible to immediately rewrite that SS field. Therefore, the sector chaining data is traced in the reverse direction to search the normal sector succeeding the abnormal sector, and rewrite the SS field.

In step S950, when the PS field is also improper, the repair is impossible. In step S1000, the abnormal end status flag is set, and the processing is completed.

After rewriting either of the PS and SS fields, in step S970, it is checked whether or not the succeeding sector is the last sector of the file depends on whether the SS field is FF or not. If it is not the last one, control is returned to step S910, and the succeeding sector is read out according to the SS field.

If it is the last one, in step S980, the sectors of the file are traced from its top sector, and the number of sectors is counted. In step S990, it is checked whether or not the count is equal to the US of the directory. When these are equal, CPU proceeds with no further processing and stops the processing. When these are not equal, the abnormal end status flag is set in step S1000, and the processing is completed.

As for the sector chaining data, the preceding and succeeding sector numbers are both stored, as described above. Therefore, it is possible to check whether or not the chaining data is proper, by comparing the chaining data of the two sectors. If the two data are not coincident with each other, the chaining data is restored into the correct one on the basis of the check sum of each sector.

As described above, according to this invention an improved IC card is provided. This invention is not limited to the particular embodiment described above and can be modified within the scope and spirit thereof.

What is claimed is:

1. An IC (integrated circuit) card comprising:
rewritable memory means with a plurality of sectors; and
memory control means for writing into said memory means, data file supplied to the IC card from a processing device outside the IC card, said memory control means including means for chaining a plurality of sectors according to the length of the data file, means for writing chain data of each sector into a predetermined portion of the sector, and means for writing for each data file data relating to the sectors constituting the data file into a predetermined sector.

2. The IC card according to claim 1, in which said memory means includes a data sector constituting the data file, a directory sector for storing data relating to the sectors constituting each data file, a file control sector for storing data relating to the directory sector, and a memory control sector for storing data relating to unused data sector, and each of said sectors including the chain data relating to the sectors preceding and succeeding to one sector, and data for indicating that the data in said sector is normal.

3. The IC card according to claim 2, in which said data sector includes a data field, a preceding sector field for storing the preceding sector number, and a succeeding sector field for storing the succeeding sector number, said directory sector includes a file name storing field, a top sector field for storing a top sector number of said file, a last sector field for storing a last sector number of said file, a used sector field for storing the size of said file (the number of sectors), the preceding sector field, the succeeding sector field, and a check field for storing check data, and said memory control sector includes a free top field for storing a top sector number of unused sectors, a free last sector field for storing a last sector number of the unused sectors, a sector number field for storing the size of the unused sectors (the number of sectors), a defining field for storing the sector number of said file control sector, the preceding sector field, the succeeding sector field, and the check field.

4. The IC card according to claim 3, in which said memory control means initializes said memory means before said memory means is used, said initializing including the steps of:

writing zero into all of the addresses of said memory means;

storing the sectors in which error occurs;

reserving the top sector of those normal sectors as a memory control sector;

reserving the normal sector succeeding to the memory control sector, as a file control sector, setting "directory" into the file name storing field of said file control sector, the number of the next normal sector succeeding to said file control sector into the top sector field, said number of the next normal sector into the last sector field, one into the used sector field, zero into said preceding sector field, and zero into said succeeding sector field, and reserving said next normal sector as a dummy directory sector;

setting the sector number of said file control sector into the defining field of said memory control sector;

chaining the remaining normal sectors (i.e. registering the numbers of the normal sectors preceding and succeeding to one sector into said preceding and succeeding sector fields of each sector), said chained normal sectors being reserved as an unused file, the sector in which write error occurs being stored as a defective sector and being excluded from the sector chain; and setting data into the free top sector field, the free last sector field, and the sector number field of said memory control sector according to the number of the stored defective sectors.

5. The IC card according to claim 1, in which said memory means is an EEPROM (electrically erasable programmable read only memory) or battery backed-up RAM (random access memory).

6. The IC card according to claim 1, in which said memory control means converts a logical address as externally supplied into an absolute address and accesses said memory means with the absolute address.

7. The IC card according to claim 1, in which said memory control means skips the defective sector when a new file is formed in said memory means.

8. An IC card comprising:

rewritable memory means including a plurality of chained data sectors constituting a data file, a directory sector for storing data relating to the sectors constituting each data file, a file control sector for storing data relating to said directory sector, each sector having a field for storing data relating to the sector preceding and succeeding to one sector, and the data indicating that the data in the sector is normal; and memory control means for reading the data file from said memory means, said memory control means including means for reading out a top sector of the data file, using the directory file and the memory control sector, means for reading out one sector succeeding to and chained with the read-out sector from the data relating to said succeeding sector, means for checking the coincidence and noncoincidence of the data relating to the succeeding sector of said read-out sector with the data relating to the preceding sector of said succeeding sector, and means for correcting, when the check result shows noncoincidence, the data relating to said preceding and succeeding sectors according to the data indicating that the data in the sector is normal.

9. The IC card according to claim 8, in which said data sector includes a data field, a preceding sector field for storing the preceding sector number, and a succeeding sector field for storing the succeeding sector number, said directory sector includes a file name storing field, a top sector field for storing a top sector number of said file, a last sector field for storing a last sector number of said file, a used sector field for storing the size of said file (the number of sectors), the preceding sector field, the succeeding sector field, and a check field for storing check data, and said memory control sector includes a free top field for storing a top sector number of unused sectors, a free last sector field for storing a last sector number of the unused sectors, a sector number field for storing the size of the unused sectors, a defining field for storing the sector number of said file control sector, the preceding sector field, the succeeding sector field, and the check field.

10. The IC card according to claim 8, in which said memory means is an EEPROM (electrically erasable programmable read only memory) or battery backed-up RAM (random access memory).

11. The IC card according to claim 8, in which said memory control means converts a logical address as externally supplied into an absolute address and accesses said memory means with the absolute address.

* * * * *